US011326836B1

(12) United States Patent
Chen et al.

(10) Patent No.: US 11,326,836 B1
(45) Date of Patent: May 10, 2022

(54) VAPOR/LIQUID CONDENSATION SYSTEM

(71) Applicant: ASIA VITAL COMPONENTS CO., LTD., New Taipei (TW)

(72) Inventors: Chih-Peng Chen, New Taipei (TW); Yu-Min Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 17/078,057

(22) Filed: Oct. 22, 2020

(51) Int. Cl.
| | |
|---|---|
| *F28B 3/00* | (2006.01) |
| *F28B 1/06* | (2006.01) |
| *F28F 3/04* | (2006.01) |
| *F28F 9/02* | (2006.01) |

(52) U.S. Cl.
CPC ............. *F28B 1/06* (2013.01); *F28F 3/04* (2013.01); *F28F 9/0209* (2013.01); *F28F 2210/10* (2013.01)

(58) Field of Classification Search
CPC ... F28B 1/06; F28F 3/04; F28F 9/0209; F28F 2210/10
USPC ................................. 165/80.4, 111
See application file for complete search history.

(56) References Cited

U.S. PATENT DOCUMENTS

| | | | | |
|---|---|---|---|---|
| 4,884,169 A | * | 11/1989 | Cutchaw ............ | H01L 23/427 257/713 |
| 6,005,772 A | * | 12/1999 | Terao ................. | F28D 15/0266 165/80.4 |
| 6,808,015 B2 | * | 10/2004 | Osakabe ............. | F28F 3/042 165/41 |
| 6,942,018 B2 | * | 9/2005 | Goodson ............ | F04B 19/006 165/80.4 |
| 7,007,506 B2 | * | 3/2006 | Kubo ................ | H05K 7/20309 165/170 |

(Continued)

FOREIGN PATENT DOCUMENTS

| | | |
|---|---|---|
| CN | 211210319 U | 8/2020 |
| JP | 2002107094 A | 4/2002 |

(Continued)

OTHER PUBLICATIONS

Search Report dated Jul. 5, 2021 issued by Taiwan Intellectual Property Office for counterpart application No. 109133385.

*Primary Examiner* — Claire E Rojohn, III
(74) *Attorney, Agent, or Firm* — Demian K. Jackson; Jackson IPG PLLC

(57) ABSTRACT

A vapor/liquid condensation system includes a condensation unit and an evaporation unit. The condensation unit is connected with the evaporation unit via conduits. The evaporation unit has a liquid inlet, a vapor outlet and an evaporation chamber in communication with each other. The evaporation unit converts liquid-phase working fluid into vapor-phase working fluid, which spreads to the condensation unit. The condensation unit cools and condenses the vapor-phase working fluid into liquid-phase working fluid, which goes back the evaporation unit. After the vapor-phase working fluid enters the condensation unit, the vapor-phase working fluid is distributed and condensed into liquid-phase working fluid. Then the liquid-phase working fluid is collected and then goes back to the evaporation unit. The length of the pipeline is shortened and the pipeline pressure is lowered to avoid interruption of heat dissipation circulation and failure in heat dissipation.

8 Claims, 12 Drawing Sheets

(56) References Cited

U.S. PATENT DOCUMENTS

| | | | |
|---|---|---|---|
| 7,013,956 B2* | 3/2006 | Thayer | F28D 15/0266 174/15.1 |
| 7,077,189 B1* | 7/2006 | Reyzin | H01L 23/473 165/83 |
| 7,215,547 B2* | 5/2007 | Chang | H05K 7/20254 174/15.1 |
| 7,604,040 B2* | 10/2009 | Ghosh | H01L 23/473 165/80.4 |
| 7,796,389 B2* | 9/2010 | Edmunds | H01L 23/427 361/700 |
| 8,016,024 B2* | 9/2011 | Kang | F28D 15/043 165/104.21 |
| 8,739,406 B2* | 6/2014 | Campbell | H05K 7/20809 29/890.035 |
| 9,019,704 B2* | 4/2015 | Rubenstein | F28F 3/12 361/698 |
| 9,061,382 B2* | 6/2015 | Campbell | B23P 15/26 |
| 10,327,355 B2* | 6/2019 | Lin | H01L 23/473 |
| 10,410,954 B2* | 9/2019 | Sun | F28D 15/02 |
| 2004/0095721 A1* | 5/2004 | Ellsworth, Jr. | H01L 23/467 361/694 |
| 2006/0000579 A1* | 1/2006 | Whitney | F28F 3/12 165/80.4 |
| 2007/0284088 A1* | 12/2007 | Chun | F28F 21/02 165/104.21 |
| 2008/0110594 A1* | 5/2008 | Martin | H01L 23/473 165/80.4 |
| 2008/0259566 A1* | 10/2008 | Fried | H05K 7/20809 361/699 |
| 2009/0008063 A1* | 1/2009 | Salinas | H01L 23/427 165/104.26 |
| 2009/0140417 A1* | 6/2009 | Refai-Ahmed | H01L 23/3732 257/707 |
| 2009/0250195 A1* | 10/2009 | Yoshida | F28F 3/02 361/702 |
| 2011/0168360 A1* | 7/2011 | Chang | F28F 3/048 165/104.31 |
| 2011/0198335 A1* | 8/2011 | Lin | H01M 10/647 219/209 |
| 2011/0200861 A1* | 8/2011 | Lin | H01M 10/6567 429/120 |
| 2015/0359133 A1* | 12/2015 | Joshi | H05K 7/20936 165/287 |
| 2016/0116226 A1* | 4/2016 | Dupont | F25B 23/00 165/104.21 |
| 2016/0131438 A1* | 5/2016 | De Troz | F28D 15/043 29/890.032 |
| 2016/0341224 A1* | 11/2016 | Lynn | B01D 1/289 |
| 2017/0089642 A1* | 3/2017 | Taras | F28F 9/0209 |
| 2019/0206916 A1* | 7/2019 | Lin | H01L 23/3114 |
| 2019/0237373 A1* | 8/2019 | Huang | H01L 24/16 |
| 2019/0252345 A1* | 8/2019 | Lin | H01L 24/13 |
| 2020/0075519 A1* | 3/2020 | Lin | H01L 23/3171 |
| 2020/0088472 A1* | 3/2020 | Lin | F28D 15/046 |
| 2021/0013256 A1* | 1/2021 | Lin | H01L 27/14636 |
| 2021/0082810 A1* | 3/2021 | Chen | H01L 25/04 |
| 2021/0111125 A1* | 4/2021 | Chen | H01L 25/50 |
| 2021/0111126 A1* | 4/2021 | Lin | H01L 23/49811 |
| 2021/0111153 A1* | 4/2021 | Lin | H01L 23/5383 |
| 2021/0118860 A1* | 4/2021 | Wu | H01L 24/16 |

FOREIGN PATENT DOCUMENTS

| | | |
|---|---|---|
| TW | M565943 U | 8/2018 |
| TW | M606229 U | 1/2021 |

\* cited by examiner

VAPOR/LIQUID CONDENSATION SYSTEM

BACKGROUND OF THE INVENTION

1. Field of the Invention

The present invention relates generally to a heat dissipation system, and more particularly to a vapor/liquid condensation system.

2. Description of the Related Art

Along with the enhancement of the performance of electronic apparatuses, the heat generated by the electronic components for processing signals and operation has become higher than the conventional electronic components. In general, the most often used heat dissipation components include heat pipe, heat sink, vapor chamber, etc. These heat dissipation components are in direct contact with the heat generation electronic components to achieve enhanced heat dissipation performance so as to prevent the electronic components from being over-heated to burn out.

Some manufacturers provide a loop heat pipe structure employing heat pipe vapor/liquid circulation concept. In the concept, an evaporation unit is connected with a condensation unit via a tube body to form a loop module. The loop heat pipe structure has the advantage that a heat dissipation system with better evaporation/condensation circulation effect is provided by itself. A capillary structure is disposed in the evaporation unit for the backflow of the working liquid and the storage thereof. The capillary structure is formed with multiple channels for the vapor to flow. At least one face of the evaporation unit is in contact with the heat source to conduct the heat. After the working liquid in the capillary structure of the evaporation unit is heated and evaporated, the vapor flows out through the channels and flows and spreads to the condensation unit through the tube body connected between the evaporation unit and the condensation unit. Eventually, the vapor working fluid is condensed at the condensation unit into liquid phase to flow back to the evaporation unit for further circulation.

However, it should be noted that in use of the condensation unit, in the case that the pipeline of the condensation unit is too long, the liquid will accumulate in the pipeline to fail to successfully flow back to the evaporation unit for further circulation. In addition, in the case that the path of the pipeline of the condensation unit is too narrow, the driving force of the vapor will be insufficient to drive the liquid to circulate. No matter what situation takes place, the circulation of the entire system will be interrupted to lose the heat dissipation function.

It is therefore tried by the applicant to provide a vapor/liquid condensation system to solve the above problems existing in the conventional heat dissipation device.

SUMMARY OF THE INVENTION

It is therefore a primary object of the present invention to provide a vapor/liquid condensation system, in which the path of the pipeline of the condensation unit is shorter.

It is a further object of the present invention to provide the above vapor/liquid condensation system, in which the resistance of the path of the pipeline is lower.

To achieve the above and other objects, the vapor/liquid condensation system of the present invention includes: a condensation unit including: a first chamber body having a vapor inlet, a liquid outlet and a partitioning section partitioning an internal space of the first chamber body into a vapor chamber and a liquid chamber, the vapor inlet being in communication with the vapor chamber, the liquid outlet being in communication with the liquid chamber; multiple vapor flow tubes, each vapor flow tube having a vapor flow tube first end and a vapor flow tube second end, the vapor flow tube first end being in communication with the vapor chamber; multiple second chamber bodies each having a fluid chamber, the vapor flow tube second end of the vapor flow tube being in communication with the fluid chamber; and multiple liquid flow tubes, each liquid flow tube having a liquid flow tube first end and a liquid flow tube second end, the liquid flow tube first end being in communication with the fluid chamber, the liquid flow tube second end being in communication with the liquid chamber; and an evaporation unit having a liquid inlet, a vapor outlet and an evaporation chamber in communication with each other, the liquid inlet being connected with the liquid outlet of the first chamber body via a conduit, the vapor outlet being connected with the vapor inlet of the first chamber body via another conduit.

Still to achieve the above and other objects, the vapor/liquid condensation system of the present invention includes: a condensation unit including: a first chamber body having a vapor inlet, a vapor outlet, a liquid inlet, a liquid outlet and a partitioning section partitioning an internal space of the first chamber body into a vapor chamber and a liquid chamber, the vapor inlet and the vapor outlet being in communication with the vapor chamber, the liquid inlet and the liquid outlet being in communication with the liquid chamber; a second chamber body having an inlet, an outlet, multiple first flow passages and a partitioning member partitioning an internal space of the second chamber body into a vapor flow chamber and a liquid flow chamber, a vapor guide member being disposed in the vapor flow chamber, a liquid guide member being disposed in the liquid flow chamber, the vapor guide member having multiple second flow passages, the liquid guide member having multiple third flow passages, the inlet and the outlet being positioned between the first flow passages, the second flow passages being in communication with the inlet, the third flow passages being in communication with the outlet, the first flow passages respectively communicating with the second and third flow passages; and multiple radiating fin assembles in contact with outer walls of the first and second chamber bodies; and an evaporation unit having a liquid inlet, a vapor outlet and an evaporation chamber in communication with each other, the liquid inlet being connected with the liquid outlet of the first chamber body via a conduit, the vapor outlet being connected with the vapor inlet of the first chamber body via another conduit.

According to the above structure, after heated at the evaporation unit, the working fluid is changed from liquid phase into vapor phase and flows through the conduit to enter the condensation unit. Then, by means of the internal structure of the condensation unit, the vapor-phase working fluid flows to left and right sides and is gradually cooled and condensed into liquid phase. Then the liquid-phase working fluid is collected from the left and right sides to the middle. Then the liquid-phase working fluid flows through the conduit back to the evaporation unit. In this case, the path of the pipeline of the condensation unit is shortened and the resistance of the pipeline is lowered to avoid interruption of heat dissipation circulation and failure in heat dissipation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
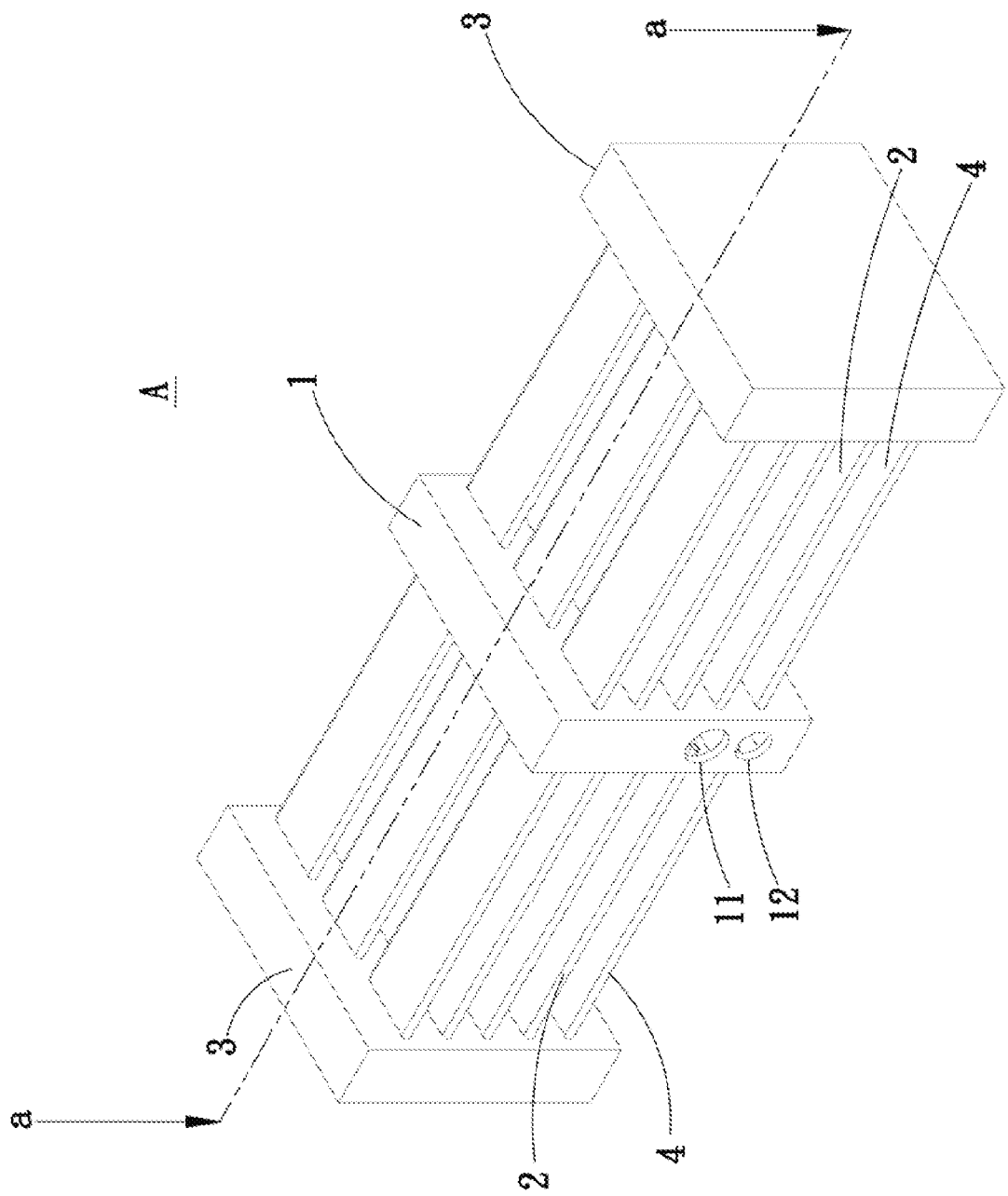
FIG. 1A is a perspective assembled view of a first embodiment of the present invention.
Figure 1B:
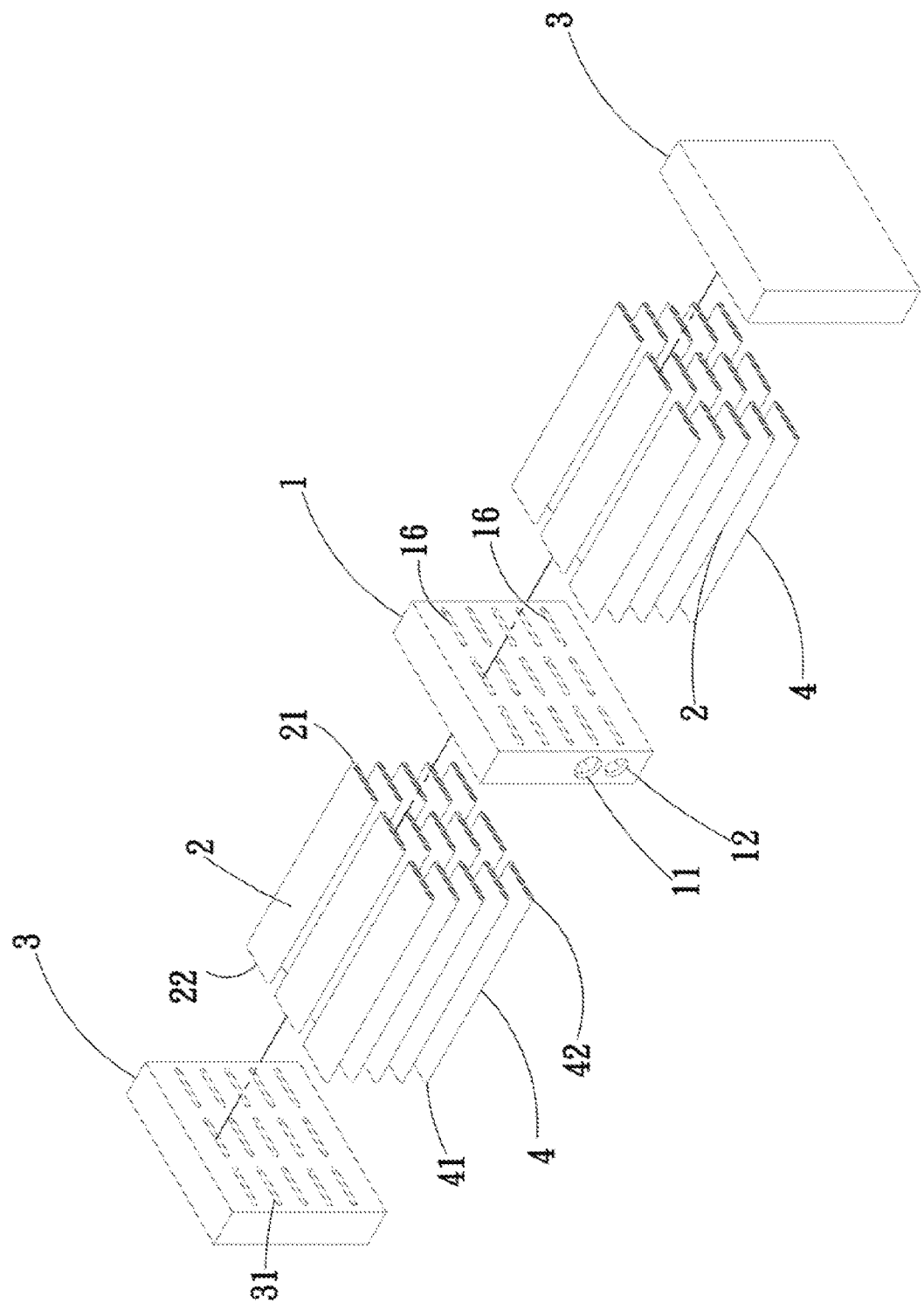
FIG. 1B is a perspective exploded view of the first embodiment of the present invention.
Figure 1C:
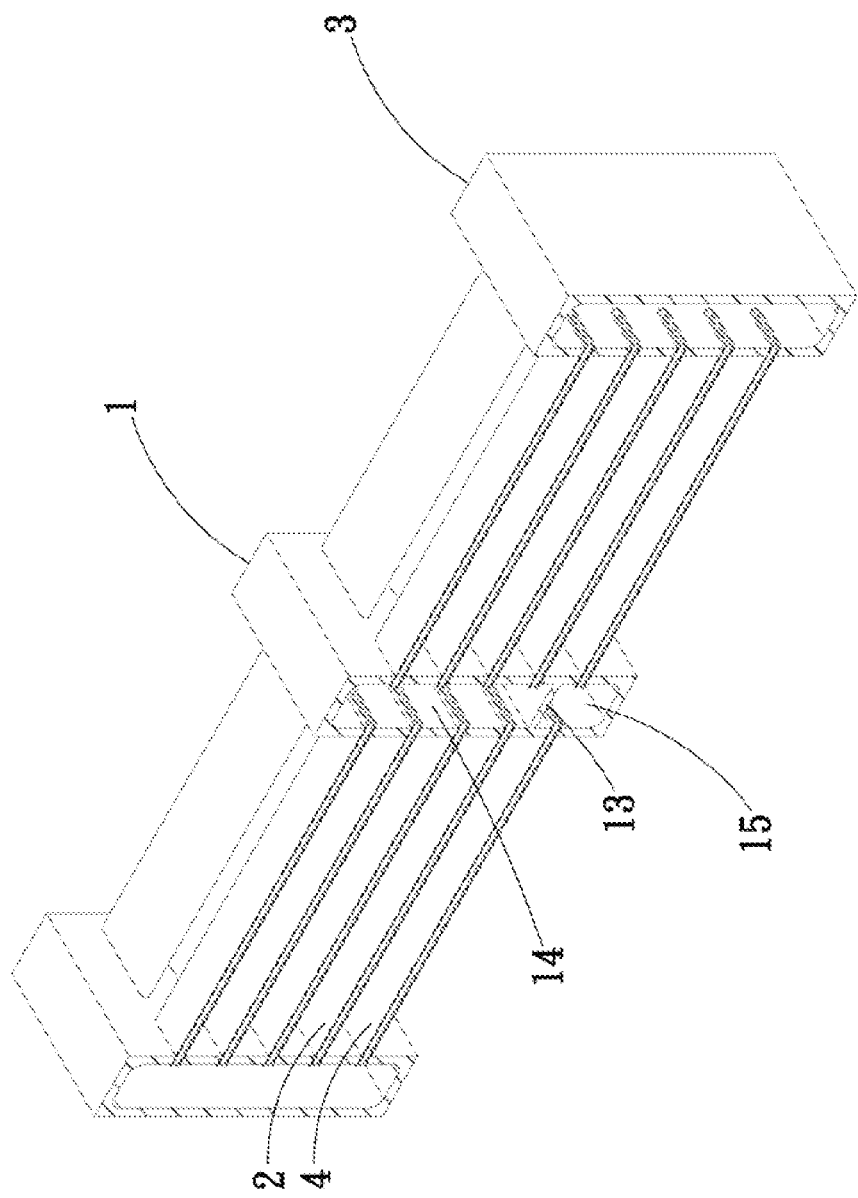
FIG. 1C is a sectional view of the first embodiment of the present invention.
Figure 1D:
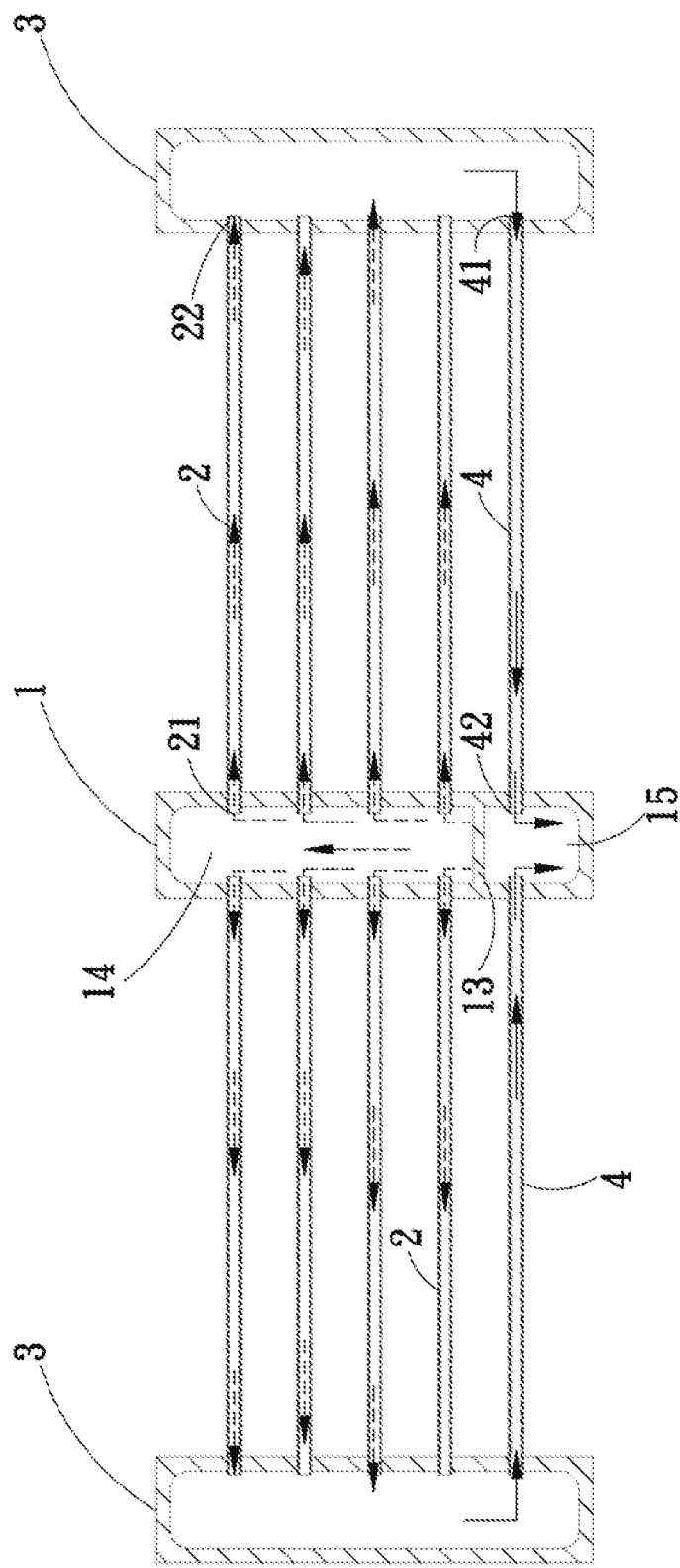
FIG. 1D is a schematic view showing the change between two phases of the working fluid of the first embodiment of the present invention.
Figure 2:
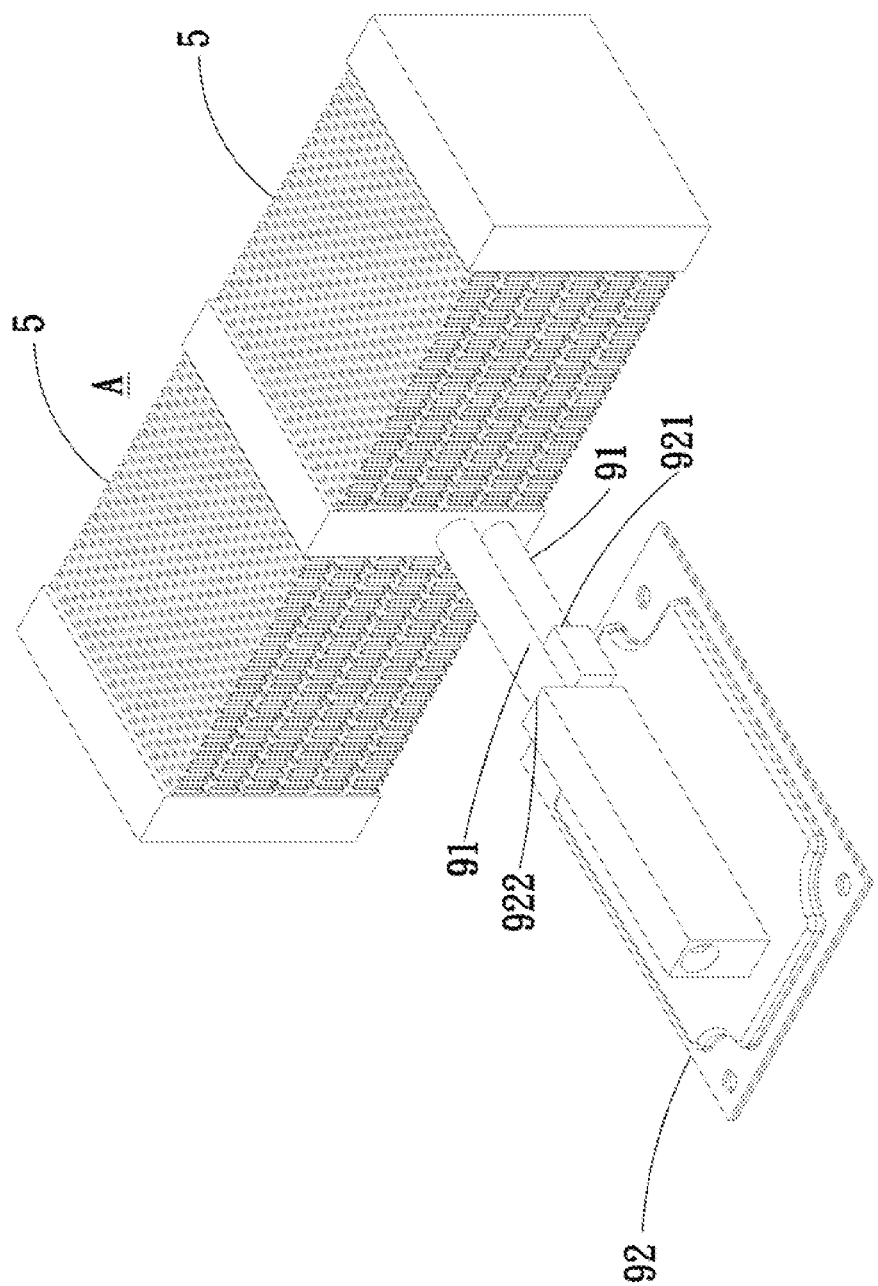
FIG. 2 is a perspective assembled view of a heat dissipation system employing the first embodiment of the present invention.

Please refer to FIGS. 1A to 1D and FIG. 2. FIG. 1A is a perspective assembled view of a first embodiment of the present invention. FIG. 1B is a perspective exploded view of the first embodiment of the present invention. FIG. 1C is a sectional view of the first embodiment of the present invention. FIG. 1D is a schematic view showing the change between two phases of the working fluid of the first embodiment of the present invention. FIG. 2 is a perspective assembled view of a heat dissipation system employing the first embodiment of the present invention. According to the first embodiment, the vapor/liquid condensation system of the present invention includes a condensation unit A and an evaporation unit 92. The condensation unit A is connected with the evaporation unit 92 via two conduits 91. The evaporation unit 92 has a liquid inlet 921, a vapor outlet 922 and an evaporation chamber (not shown) in communication with each other. According to use requirement, the evaporation chamber can be designed with a flow passage to prolong the time for which the fluid stays in the evaporation unit 92. Alternatively, radiating fins can be additionally arranged to enhance heat conduction effect. First ends of the conduits 91 are respectively connected with the liquid inlet 921 and the vapor outlet 922. Second ends of the conduits 91 are respectively connected with a vapor inlet 11 and a liquid outlet 12 of a first chamber body 1 of the condensation unit A.

The condensation unit A includes a first chamber body 1, multiple vapor flow tubes 2, multiple second chamber bodies 3, multiple liquid flow tubes 4 and multiple radiating fin assemblies 5. The first chamber body 1 is positioned at the middle of the condensation unit A. The second chamber bodies 3 are positioned on left and right sides of the first chamber body 1. Two ends of the vapor flow tubes 2 and the liquid flow tubes 4 are respectively connected with the first and second chamber bodies 1, 3. The radiating fin assemblies 5 are respectively disposed on outer sides of the vapor flow tubes 2 and the liquid flow tubes 4.

The first chamber body 1 has a vapor inlet 11, a liquid outlet 12, a partitioning section 13, a vapor chamber 14, a liquid chamber 15 and multiple perforations 16. The partitioning section 13 partitions the internal space of the first chamber body 1 into the vapor chamber 14 and the liquid chamber 15. The vapor inlet 11 is in communication with the vapor chamber 14. The liquid outlet 12 is in communication with the liquid chamber 15. The perforations are respectively disposed a left side and a right side of the first chamber body 1. The space of the vapor chamber is larger than or equal to the space of the liquid chamber 15. The vapor chamber 14 is positioned on upper side of the liquid chamber 15 and the vapor inlet 11 is positioned in a lower position of the vapor chamber 14.

The vapor flow tube 2 has a vapor flow tube first end 21 and a vapor flow tube second end 22. The vapor flow tube first end 21 is connected with the perforation 16 of the first chamber body 1. The vapor flow tube second end 22 is connected with the perforation 31 of the second chamber body 3. The vapor flow tubes 2 are further classified into multiple left vapor flow tubes and multiple right vapor flow tubes. The length of the left vapor flow tubes is equal to the length of the right vapor flow tubes.

The liquid flow tube 4 has a liquid flow tube first end 41 and a liquid flow tube second end 42. The liquid flow tube second end 42 is connected with the perforation 16 of the first chamber body 1. The liquid flow tube first end 41 is connected with the perforation 31 of the second chamber body 3. The liquid flow tubes 4 are further classified into multiple left liquid flow tubes and multiple right liquid flow tubes. The length of the left liquid flow tubes is equal to the length of the right liquid flow tubes.

Please now refer to FIGS. 1A to 1D and FIG. 2. For easy description, it is first defined that the arrows in the drawings show the moving direction of the working fluid. The phantom lines mean the vapor-phase working fluid, while the solid lines mean the liquid-phase working fluid. The working fluid will flow within the vapor/liquid condensation system to change between vapor phase and liquid phase. In practical use of the vapor/liquid condensation system of the present invention, the heat contact face of the evaporation unit 92 is in contact with a heat source (not shown). After heated, the working fluid is changed from liquid phase into vapor phase and flows from the upper conduit 91 into the vapor chamber 14 of the first chamber body 1. After the vapor-phase working fluid enters the vapor chamber 14, the vapor-phase working fluid will naturally flow upward to enter the vapor flow tube 2 from the upper perforation 16. The vapor-phase working fluid flows from the vapor flow tube first end 21 to the vapor flow tube second end 22 and flows from the upper perforation 31 into the second chamber body 3. In the flowing process, the heat of the working fluid is continuously dissipated and the vapor-phase working fluid is changed into liquid-phase working fluid (condensed). It can be clearly seen from FIG. 1D that the liquid-phase working fluid naturally drops down due to gravity to enter the liquid flow tube 4 from the lower perforation 31. The liquid-phase working fluid flows from the liquid flow tube first end 41 to the liquid flow tube second end 42 and enters the liquid chamber 15 from the lower perforation 16. Then the liquid-phase working fluid flows from the liquid outlet 12 through the lower conduit 91 back into the evaporation chamber of the evaporation unit 92.

It should be noted that in this embodiment, only the lowermost layer is the liquid flow tubes 4, while the other parts are all the vapor flow tubes 2. However, in practice, the number of the vapor flow tubes 2 and the number of the liquid flow tube 4 can be freely increased or decreased. Preferably, the number of the vapor flow tubes 2 is slightly more than the number of the liquid flow tube 4, whereby the total pipeline diameter of the vapor flow tubes 2 is larger than the total pipeline diameter of the liquid flow tubes 4.

Moreover, in order to make the liquid-phase working fluid more smoothly flow, a capillary structure (not shown) can be properly additionally disposed in the liquid flow tubes 4 or the second chamber body 3. Accordingly, by means of the capillary structure, the liquid-phase working fluid can more smoothly flow back to the liquid chamber 15 to make the entire circulation smoother.

Figure 3A:
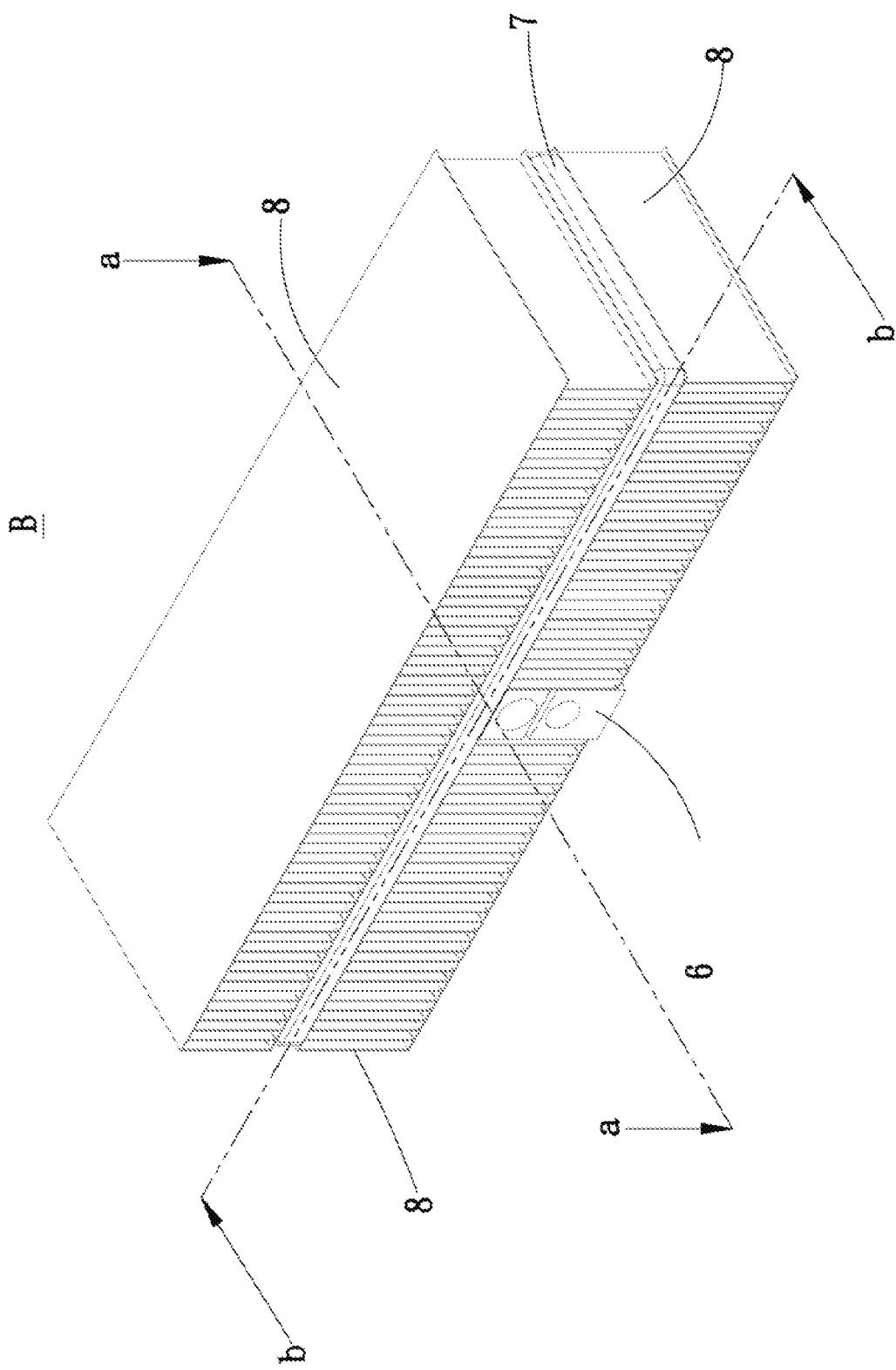
FIG. 3A is a perspective assembled view of a second embodiment of the present invention.
Figure 3B:
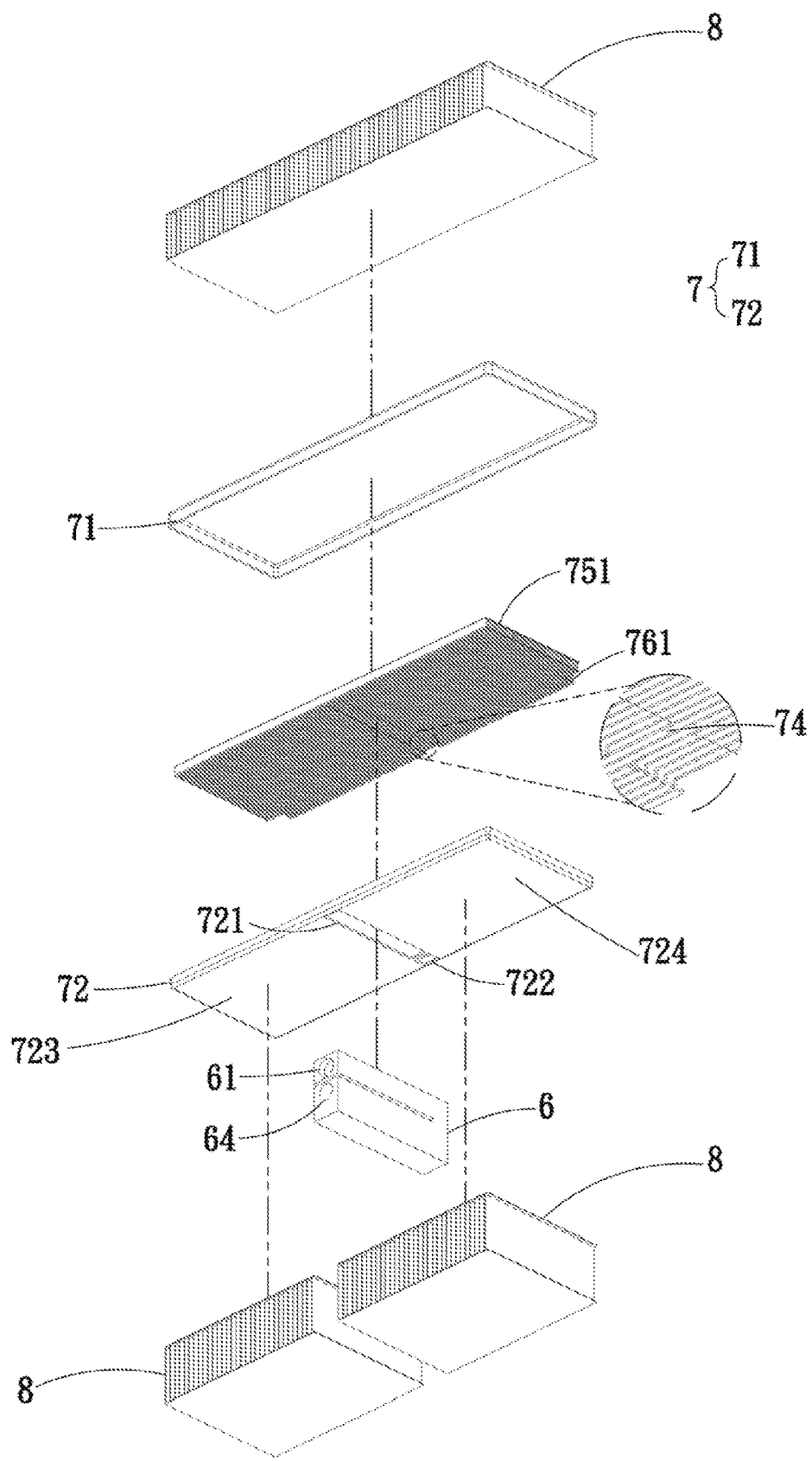
FIG. 3B is a perspective exploded view of the second embodiment of the present invention.
Figure 4A:
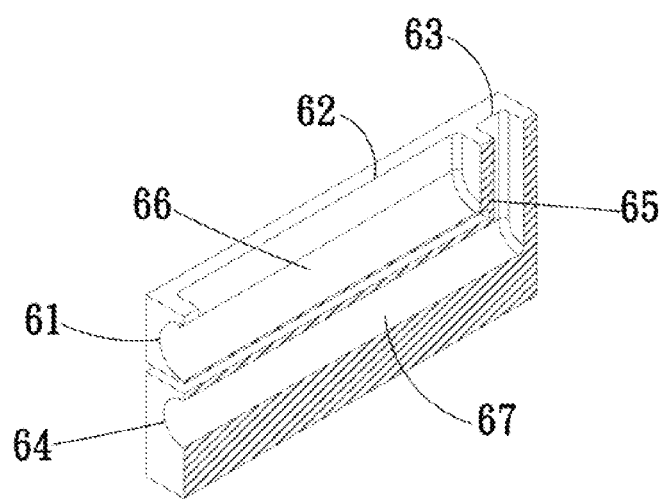
FIG. 4A is a sectional view showing the first chamber body of the second embodiment of the present invention.
Figure 4B:
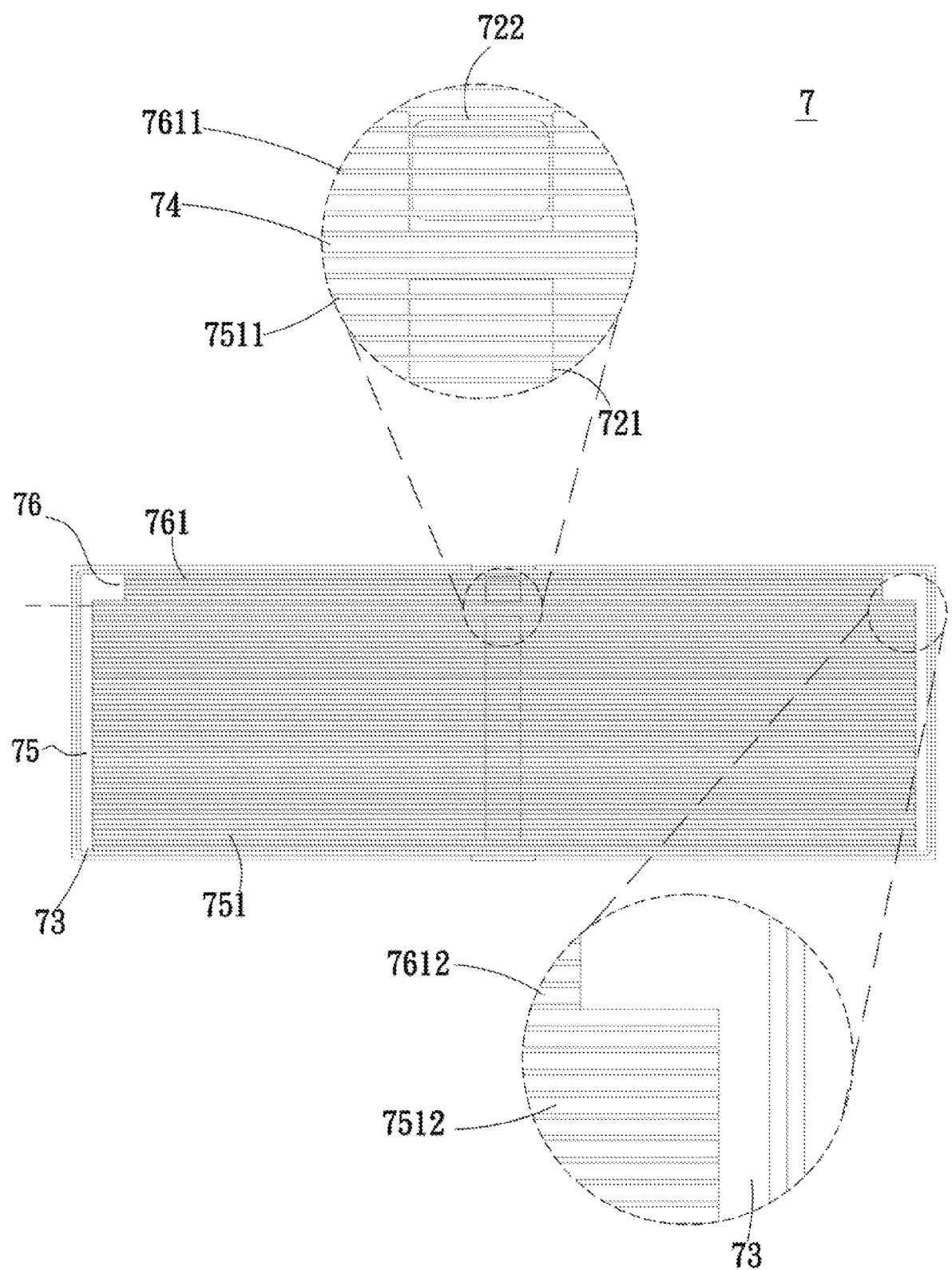
FIG. 4B is a sectional view showing the second chamber body of the second embodiment of the present invention.
Figure 5A:
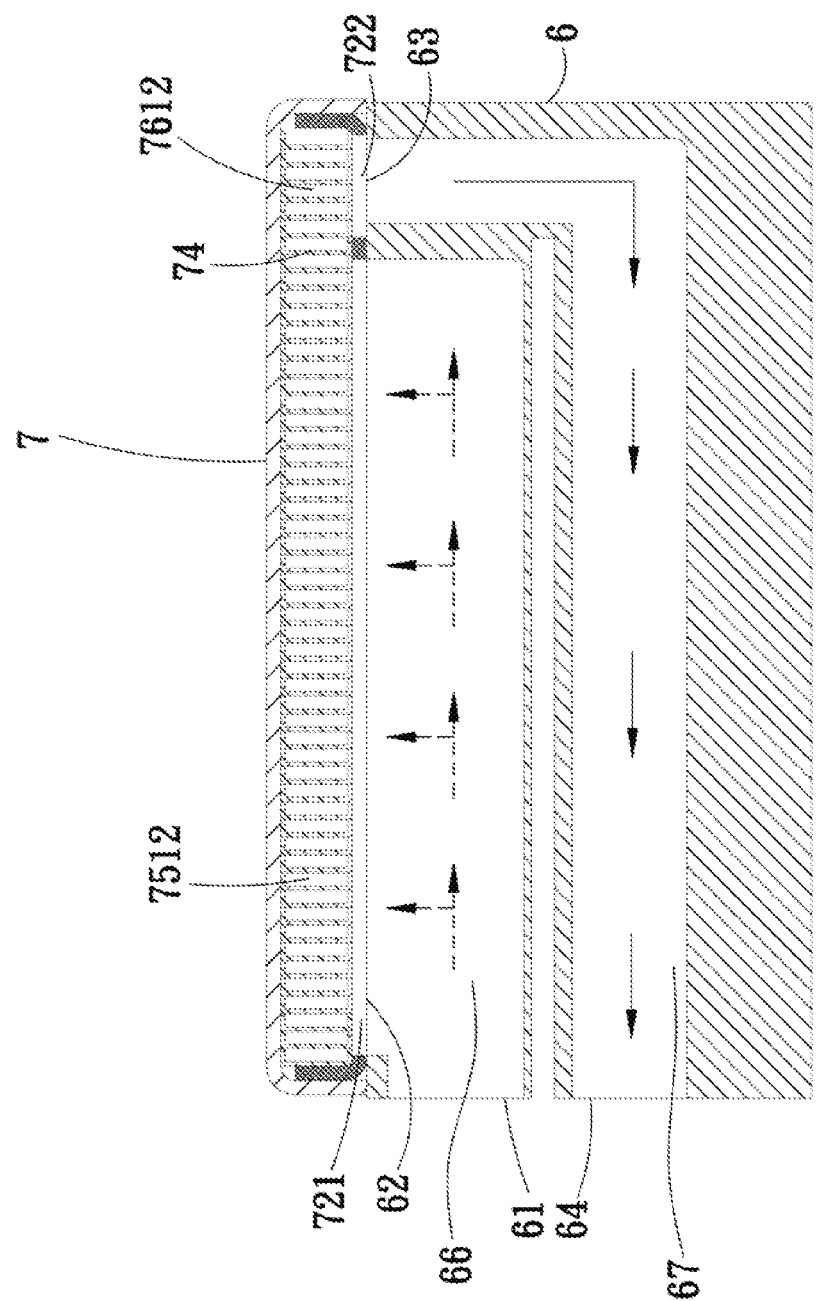
FIG. 5A is a schematic view showing the change between two phases of the working fluid of the second embodiment of the present invention in a first state.
Figure 5B:
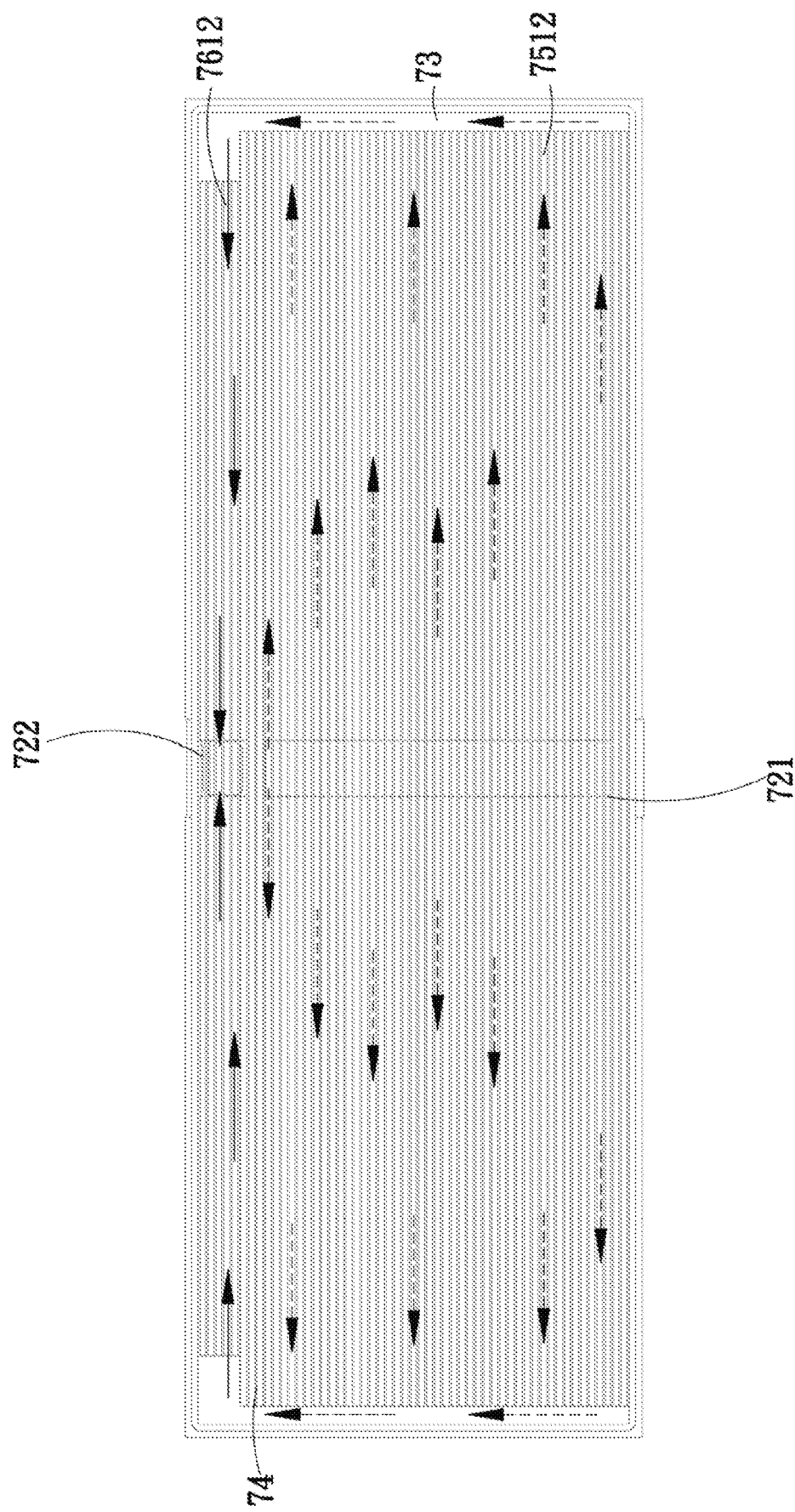
FIG. 5B is a schematic view showing the change between two phases of the working fluid of the second embodiment of the present invention in a second state.
Figure 6:
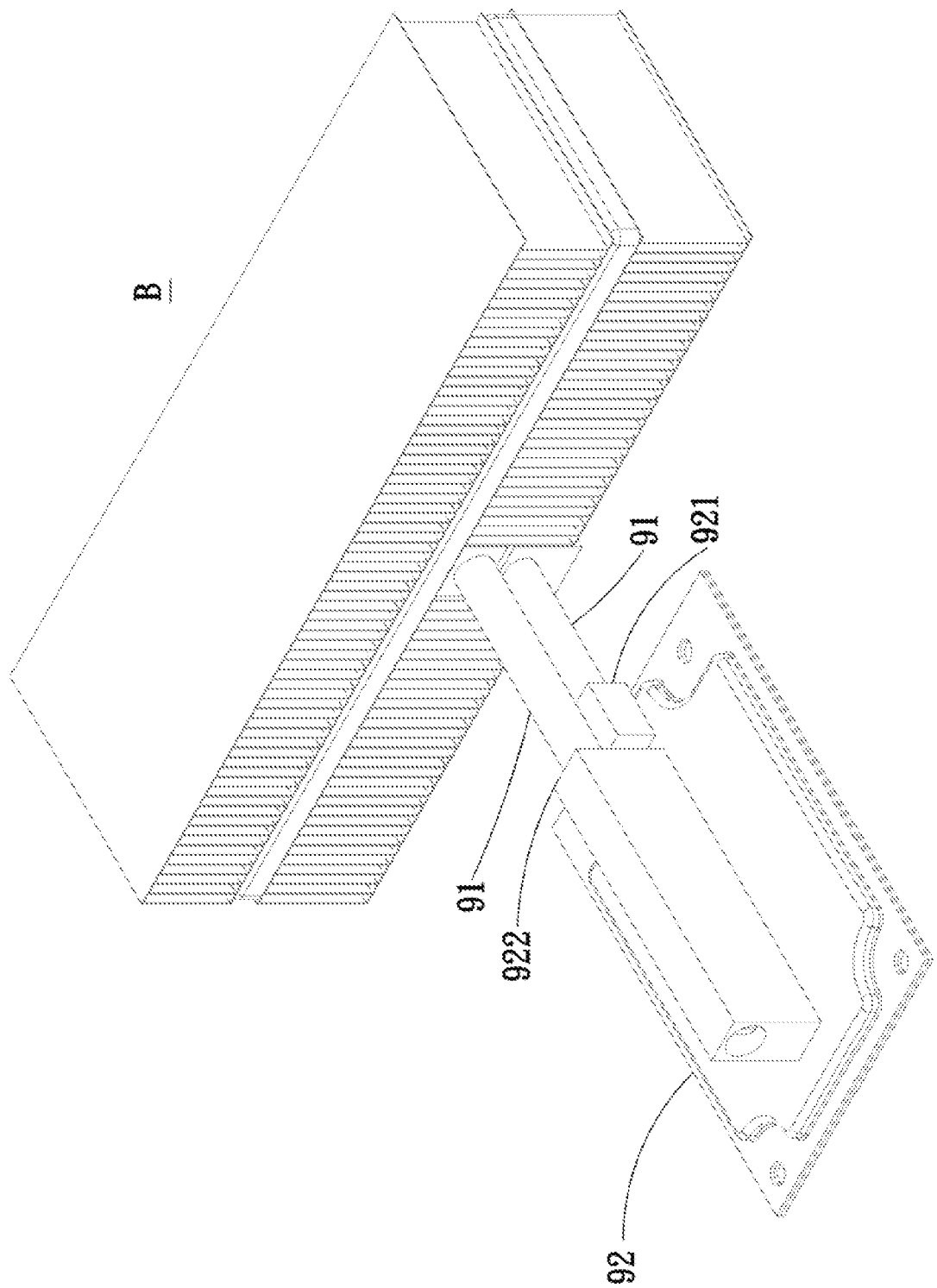
FIG. 6 is a perspective assembled view of a heat dissipation system employing the second embodiment of the present invention.

Please now refer to FIGS. 3A, 3B, 4A, 4B, 5A, 5B and 6. FIG. 3A is a perspective assembled view of a second embodiment of the present invention. FIG. 3B is a perspective exploded view of the second embodiment of the present invention. FIG. 4A is a sectional view showing the first chamber body of the second embodiment of the present invention. FIG. 4B is a sectional view showing the second chamber body of the second embodiment of the present invention. FIG. 5A is a schematic view showing the change between two phases of the working fluid of the second embodiment of the present invention in a first state. FIG. 5B is a schematic view showing the change between two phases of the working fluid of the second embodiment of the present invention in a second state. FIG. 6 is a perspective assembled view of a heat dissipation system employing the second embodiment of the present invention. In the second embodiment of the present invention, the vapor/liquid condensation system includes a condensation unit B and an evaporation unit 92. The structure of the condensation unit 92 is identical to that of the first embodiment and thus will not be redundantly described hereinafter. First ends of the conduits 91 are respectively connected with the liquid inlet 921 and the vapor outlet 922. Second ends of the conduits 91 are respectively connected with a vapor inlet 61 and a liquid outlet 64 of a first chamber body 6 of the condensation unit B.

The condensation unit B includes a first chamber body 6, a second chamber body 7 and multiple radiating fin assemblies 8. The first chamber body 6 is mated with the second chamber body 7. The second chamber body 7 is positioned on upper side of the first chamber body 6. The radiating fin assembles 5 are in contact with the outer walls of the first and second chamber bodies 6, 7.

The first chamber body 6 has a vapor inlet 61, a vapor outlet 62, a liquid inlet 63, a liquid outlet 64 and a partitioning section 65 partitioning the internal space of the first chamber body 1 into a vapor chamber 66 and a liquid chamber 67. The vapor inlet 61 and the vapor outlet 62 are in communication with the vapor chamber 66. The liquid inlet 63 and the liquid outlet 64 are in communication with the liquid chamber 67. The vapor chamber 66 is positioned on upper side of the liquid chamber 67.

The second chamber body 7 has an inlet 721, an outlet 722, multiple first flow passages 73 and a partitioning member 74 partitioning the internal space of the second chamber body 7 into a vapor flow chamber 75 and a liquid flow chamber 76. A vapor guide member 751 is disposed in the vapor flow chamber 75. A liquid guide member 761 is disposed in the liquid flow chamber 76. The vapor guide member 751 has multiple second flow passages 7512. The liquid guide member 761 has multiple third flow passages 7612. The inlet 721 and the outlet 722 are positioned between the first flow passages 73. The second flow passages 7512 are in communication with the inlet 721. The third flow passages 7612 are in communication with the outlet 722. The first flow passages 73 respectively communicate with the second and third flow passages 7512, 7612.

The vapor guide member 751 is composed of multiple radiating fins 7511, which are sequentially arranged and assembled. The vapor guide member 751 has a vapor opening section 7513. Each two adjacent radiating fins 7511 define therebetween one of the second flow passages 7512. The vapor opening section 7513 is mated with the inlet 721. The liquid guide member 761 is composed of multiple radiating fins 7611, which are sequentially arranged and assembled. The liquid guide member 761 has a liquid opening section 7613. Each two adjacent radiating fins 7611 define therebetween one of the third flow passages 7612. The liquid opening section 7613 is mated with the outlet 722. The space of the vapor flow chamber 75 is larger than or equal to the space of the liquid flow chamber 76. The area of the inlet 721 is larger than or equal to the area of the outlet 722.

In addition, the second chamber body 7 includes an upper cover 71 and a lower cover 72. The inlet 721 and the outlet 722 are positioned in the middle of the lower cover 72. The lower cover 72 is further defined with a left side section 723 and a right side section 724. The radiating fin assemblies 8 are respectively disposed on the upper cover 71, the left side section 723 of the lower cover 72 and the right side section 724 of the lower cover 72.

Please now refer to FIGS. 3A to 5B and FIG. 6. As in the first embodiment, for easy description, it is first defined that the arrows in the drawings show the moving direction of the working fluid. The phantom lines mean the vapor-phase working fluid, while the solid lines mean the liquid-phase working fluid. The working fluid will flow within the vapor/liquid condensation system to change between vapor phase and liquid phase. After heated at the evaporation unit 92, the working fluid is changed from liquid phase into vapor phase and flows through the upper conduit 91 to enter the vapor chamber 66 from the vapor inlet 61. Then the vapor-phase working fluid leaves the vapor chamber 66 from the vapor outlet 62 and enters the vapor flow chamber 75 from the inlet 721. The vapor-phase working fluid enters the vapor guide member 751 from the vapor opening section 7513. The vapor-phase working fluid spreads to left and right sides along the second flow passages 7512. In the spreading process, the vapor-phase working fluid is gradually cooled and condensed into liquid phase. The working fluid then flows from the second flow passages 7512 through the first flow passages 73 into the third flow passages 7612. At this time, the working fluid is fully cooled and changed from vapor phase to liquid phase. The liquid-phase working fluid is collected to the middle along the third flow passages 7612 and leaves the liquid guide member 761 from the liquid opening section 7613. Then the liquid-phase working fluid flows through the outlet 722 to leave the second chamber body 7. The liquid-phase working fluid enters the liquid chamber 67 from the liquid inlet 63 and then leaves from the liquid outlet 64. Then the liquid-phase working fluid flows through the lower conduit 91 back to the evaporation unit 92 for heat dissipation circulation.

In order to make the liquid-phase working fluid more smoothly flow, a capillary structure (not shown) can be properly additionally disposed in the first and second flow passages 73, 7512. Accordingly, by means of the capillary structure, the liquid-phase working fluid can more smoothly flow back to the liquid chamber 67 to make the entire circulation smoother.

It should be noted that in this embodiment, the number of the second flow passages 7512 is obviously more than the number of the third flow passages 7612. However, in practice, the numbers of the second and third flow passages 7512, 7612 can be freely changed. Preferably, the number of the second flow passages 7512 is more than the number of the third flow passages 7612, whereby the total pipeline diameter of the second flow passages 7512 is larger than the total pipeline diameter of the third flow passages 7612.

To speak in short, in both the above two embodiments of the present invention, the structure is improved to make the vapor-phase working fluid flow to left and right sides, while the liquid-phase working fluid collected to the middle. In addition, multiple paths for the vapor-phase working fluid to flow are provided so that the path of the pipeline of the working fluid is shortened. In addition, multiple vapor paths and liquid paths are provided to lower the resistance of the pipeline. Therefore, the working fluid is prevented from being condensed into liquid phase too early to lead to insufficient vapor pressure and cause blocking and failure in heat dissipation circulation.

In conclusion, in comparison with the conventional technique, the present invention has the following advantages:
1. The path of the working fluid is shortened.
2. The resistance of the pipeline of the working fluid is lowered.
3. Multiple vapor paths and liquid paths are provided to avoid failure in heat dissipation circulation due to blocking of the liquid.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A vapor/liquid condensation system comprising:
a condensation unit including:
a first chamber body having a vapor inlet, a vapor outlet, a liquid inlet, a liquid outlet and a partitioning section partitioning an internal space of the first chamber body into a vapor chamber and a liquid chamber, the vapor inlet and the vapor outlet being in communication with the vapor chamber, the liquid inlet and the liquid outlet being in communication with the liquid chamber;
a second chamber body having an inlet, an outlet, multiple first flow passages and a partitioning member partitioning an internal space of the second chamber body into a vapor flow chamber and a liquid flow chamber, a vapor guide member being disposed in the vapor flow chamber, a liquid guide member being disposed in the liquid flow chamber, the vapor guide member having multiple second flow passages, the liquid guide member having multiple third flow passages, the inlet and the outlet being positioned between the first flow passages, the second flow passages being in communication with the inlet, the third flow passages being in communication with the outlet, the first flow passages respectively communicating with the second and third flow passages; and
multiple radiating fin assembles in contact with outer walls of the first and second chamber bodies; and
an evaporation unit having a liquid inlet, a vapor outlet and an evaporation chamber in communication with each other, the liquid inlet being connected with the liquid outlet of the first chamber body via a conduit, the vapor outlet being connected with the vapor inlet of the first chamber body via another conduit.

2. The vapor/liquid condensation system as claimed in claim 1, wherein the vapor guide member is composed of multiple radiating fins, which are sequentially arranged and assembled, the vapor guide member having a vapor opening section, each two adjacent radiating fins defining therebetween one of the second flow passages, the vapor opening section being mated with the inlet.

3. The vapor/liquid condensation system as claimed in claim 1, wherein the liquid guide member is composed of multiple radiating fins, which are sequentially arranged and assembled, the liquid guide member having a liquid opening section, each two adjacent radiating fins defining therebetween one of the third flow passages, the liquid opening section being mated with the outlet.

4. The vapor/liquid condensation system as claimed in claim 1, wherein the space of the vapor flow chamber is larger than or equal to the space of the liquid flow chamber.

5. The vapor/liquid condensation system as claimed in claim 1, wherein the vapor chamber is positioned on upper side of the liquid chamber.

6. The vapor/liquid condensation system as claimed in claim 1, wherein the area of the inlet is larger than or equal to the area of the outlet.

7. The vapor/liquid condensation system as claimed in claim 1, wherein the second chamber body includes an upper cover and a lower cover, the inlet and the outlet being positioned in the middle of the lower cover.

8. The vapor/liquid condensation system as claimed in claim 7, wherein the lower cover is further defined with a left side section and a right side section, the radiating fin assemblies being respectively disposed on the upper cover, the left side section of the lower cover and the right side section of the lower cover.

* * * * *